(12) United States Patent
Nakajima

(10) Patent No.: US 6,205,027 B1
(45) Date of Patent: Mar. 20, 2001

(54) STRUCTURE AND METHOD FOR MOUNTING A CIRCUIT MODULE

(75) Inventor: Yuji Nakajima, Minato-ku (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/280,584

(22) Filed: Mar. 30, 1999

(30) Foreign Application Priority Data

Apr. 1, 1998 (JP) .................................................. 10-088785

(51) Int. Cl.⁷ ...................................................... H05K 7/20
(52) U.S. Cl. ............................................. 361/719; 361/687
(58) Field of Search .................................. 165/80.3, 185; 361/687, 704, 705, 717–719, 784, 785

(56) References Cited

FOREIGN PATENT DOCUMENTS

| 5-029744 | 2/1993 | (JP) . |
| 5-110272 | 4/1993 | (JP) . |
| 8-228059 | 9/1996 | (JP) . |

*Primary Examiner*—Gerald Tolin
(74) *Attorney, Agent, or Firm*—Oblon, Spivak, McClelland, Maier & Neustadt, P.C.

(57) ABSTRACT

A circuit module mounting structure is described as well as a method for mounting a multi-chip CPU module to a slim and light-weight hand-held computer. To strengthen a grounding connection of the multi-chip in the CPU module, a wiring board includes a first printed grounding pattern which is coupled to a second printed grounding pattern. In the CPU module, fasteners commonly fix both the first and the second grounding patterns through a plurality of bosses.

19 Claims, 10 Drawing Sheets

STRUCTURE AND METHOD FOR MOUNTING A CIRCUIT MODULE

CROSS REFERENCE TO RELATED APPLICATION

This application relates to Japanese Patent Application No. 10-88785 which was filed on Apr. 1, 1998, and which is incorporated herein by reference.

BACKGROUND OF THE INVENTION

1. Field of the Invention

The present invention relates to a structure and method for mounting a circuit module suitable for electronic equipment, and more particularly, to a structure for enhancing a ground connection of a multi-chip module suitable for electronic equipment, especially to a handheld computer with a slim body.

2. Discussion of the Related Art

Many types of electronic equipment are utilizing IC packages for performing at higher operational speeds and have small and light bodies.

Recently, a multi-chip module (MCM) was used as a package for the coming generation of small and light electrical equipment because the MCM can achieve higher operational speeds and efficiencies for electronic equipment, i.e., a hand-held computer when compared to a single chip module (SCM).

The MCM package includes a wiring board for mounting a plurality of IC chips on it. However, the SCM package includes only one IC chip on the wiring board. The SCM is inferior to the MCM for a signal transmission speed between the IC chip and the wiring boards.

Presently, the MCM is usually mounted on a main circuit board by using a plurality of stacking connectors. Each of the stacking connectors is constructed of a pair of male and female connectors for coupling with each other. Either one of the male connector or the female connector is soldered on a wiring board. The other connector of the pair is soldered on the main circuit board. Thus, the grounding of the MCM and the main circuit board is achieved through a grounding terminal on the stacking connector.

Consequently, one needs to increase the number of grounding terminals for the stacking connectors in order to strengthen the grounding connection or a magnetic shield for the MCM. However, it is difficult to increase the number of grounding terminals since one must change the structure of the stacking connectors.

Further, presently, there are slight variations among the heights of the IC chips in the MCM since the respective IC chips are mounted on the circuit board by coupling the pair of male and female connectors. Thus, the connectors happen to vary slightly in their coupling strengths during the connecting process for the stacking connectors.

The variation among the stacking connectors causes a problem for small-sized electrical equipment, particularly for equipment with a slim body, such as a hand-held computer.

One need for the hand-held computer with the slim body is to install a heat sink for cooling the CPU module made for the MCM. For achieving a sufficient cooling effect, it is important to maintain a particular clearance between the MCM and the heat sink. Since the hand-held computer with the slim body does not have sufficient space for providing many chip devices, the variation among the stacking connectors influences the clearance between the MCM and the heat sink.

If the clearance between the MCM and the heat sink is too much larger than a particular value, a thermal conduction from the MCM is prevented. On the contrary, if the clearance is too much smaller than a particular value, the MCM is pressed against the heat sink. This closeness has bad effects for the operation of the MCM.

SUMMARY OF THE INVENTION

Accordingly, it is object of the present invention to solve the aforementioned problems and defects of the conventional circuit module structure including a plurality of IC chips on a base circuit board.

Another object of the present invention is to provide a novel structure and method for mounting the circuit module on the base circuit board with strengthening of the grounding connection for the plurality of IC chips in the circuit module without changing the connecting structures for the plurality of IC chips.

A further object of the present invention is to provide a novel structure and method for mounting a circuit module on a base circuit board while keeping a precise distance between them.

A still further object of the present invention is to provide a novel structure and method for mounting a CPU module on a base circuit board in a hand-held computer for strengthening the ground connection or the magnetic shield of a plurality of IC chips in the CPU module without changing the connecting structures for the plurality of IC chips.

A still further object of the present invention is to provide a novel structure and method for mounting the CPU module on a base circuit board for a compact hand-held computer while keeping a precise distance between them.

A still further object of the present invention is to provide a novel structure and method for mounting a CPU module on a base circuit board in a hand-held computer by a simple fixing means.

For achieving these objects, a circuit module mounting structure according to the present invention comprises a circuit module including a wiring board provided with a printed grounding pattern, a plurality of IC chips mounted on the wiring board, and a housing case for containing the wiring board. The plurality of IC chips is connected to the printed grounding pattern, the wiring board has a plurality of first holes through the printed grounding pattern, and the housing case has a plurality of second through holes which correspond to the first through holes.

A base circuit board for mounting the circuit module in a predetermined mounting area on the base circuit board has a plurality of third through holes which correspond to the first through holes of the wiring board. Each of the plurality of third through holes is surrounded by a land portion provided on the base circuit board for securing a connection to the printed grounding pattern within the predetermined mounting area.

A means for supporting the circuit module at the predetermined mounting area on the base circuit board includes a plurality of attached bosses for coupling together the plurality of first through holes of the wiring board and the plurality of second through holes of the housing case, respectively.

Also, there are means for firmly fixing the connection among the plurality of attached bosses and the plurality of first through holes in the wiring board and also for fixing the connection among the plurality of attached bosses and the plurality of second through holes in the base circuit.

Further, the hand-held computer having a CPU module mounting structure according to the present invention is characterized in that it is comprised of the CPU module including a wiring board provided with a printed grounding pattern, a plurality of IC chips mounted on the wiring board, and a housing case for containing the wiring board. The plurality of IC chips is connected to the printed grounding pattern, the wiring board has a plurality of first holes through the printed grounding pattern, and the housing case has a plurality of second through holes which correspond to the first through holes.

A base circuit board for mounting the CPU module in a predetermined mounting area on the base circuit board has a plurality of third through holes which correspond to the first through holes in the wiring board. Each of the plurality of third through holes is surrounded by a land portion provided on the base circuit board for securing a connection to the printed grounding pattern within the predetermined mounting area.

A means for supporting the CPU module at the predetermined mounting area on the base circuit board includes a plurality of attached bosses for coupling together the plurality of first through holes of the wiring board and the plurality of second through holes of the housing case, respectively.

Additionally, there are means for commonly fixing the plurality of attached bosses which correspond to the plurality of first through holes in the wiring board and also for fixing the plurality of attached bosses which correspond to the plurality of second through holes in the housing case.

Further, the method for mounting a circuit module on a base circuit board is characterized in that it is comprised of the steps of providing a circuit module comprised of a wiring board provided with a printed grounding pattern, a plurality of IC chips mounted on the wiring board, and a housing case for containing the wiring board. The plurality of IC chips is connected to the printed grounding pattern, the wiring board has a plurality of first holes through the printed grounding pattern, and the housing case has a plurality of second through holes which correspond to the first through holes.

The next step is mounting the circuit module on a base circuit board at a predetermined mounting area on the base circuit board which has a plurality of third through holes which correspond to the first through holes in the wiring board. Each of the plurality of third through holes is surrounded by a land portion provided on the base circuit board for securing a connection to the printed grounding pattern within the predetermined mounting area.

The penultimate step is supporting the circuit module at the predetermined mounting area on the base circuit board by using a supporting means which is comprised of a supporting frame and a plurality of bosses attached to the frame for coupling together the plurality of first through holes in the wiring board and the plurality of second through holes in the housing case, respectively.

The last step is fixing the plurality of attached bosses to the main circuit board via the corresponding plurality of first through holes in the wiring board and also with the corresponding plurality of second through holes in the housing case.

BRIEF DESCRIPTION OF THE DRAWINGS

A more complete appreciation of the present invention and its many attendant advantages thereof will be readily obtained as the same becomes better understood by reference to the following detailed description when considered in connection with the accompanying drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

A stricture of the present invention enhances a grounding connection or an electromagnetic shield between a multi-chip IC module and a base circuit board for a computer without increasing the number of grounding terminals for the IC module. Such an enhanced grounding connection or electromagnetic shield is achieved by coupling the multi-chip IC module and the base circuit board through a particular structure, as will be explained below.

Figure 1:
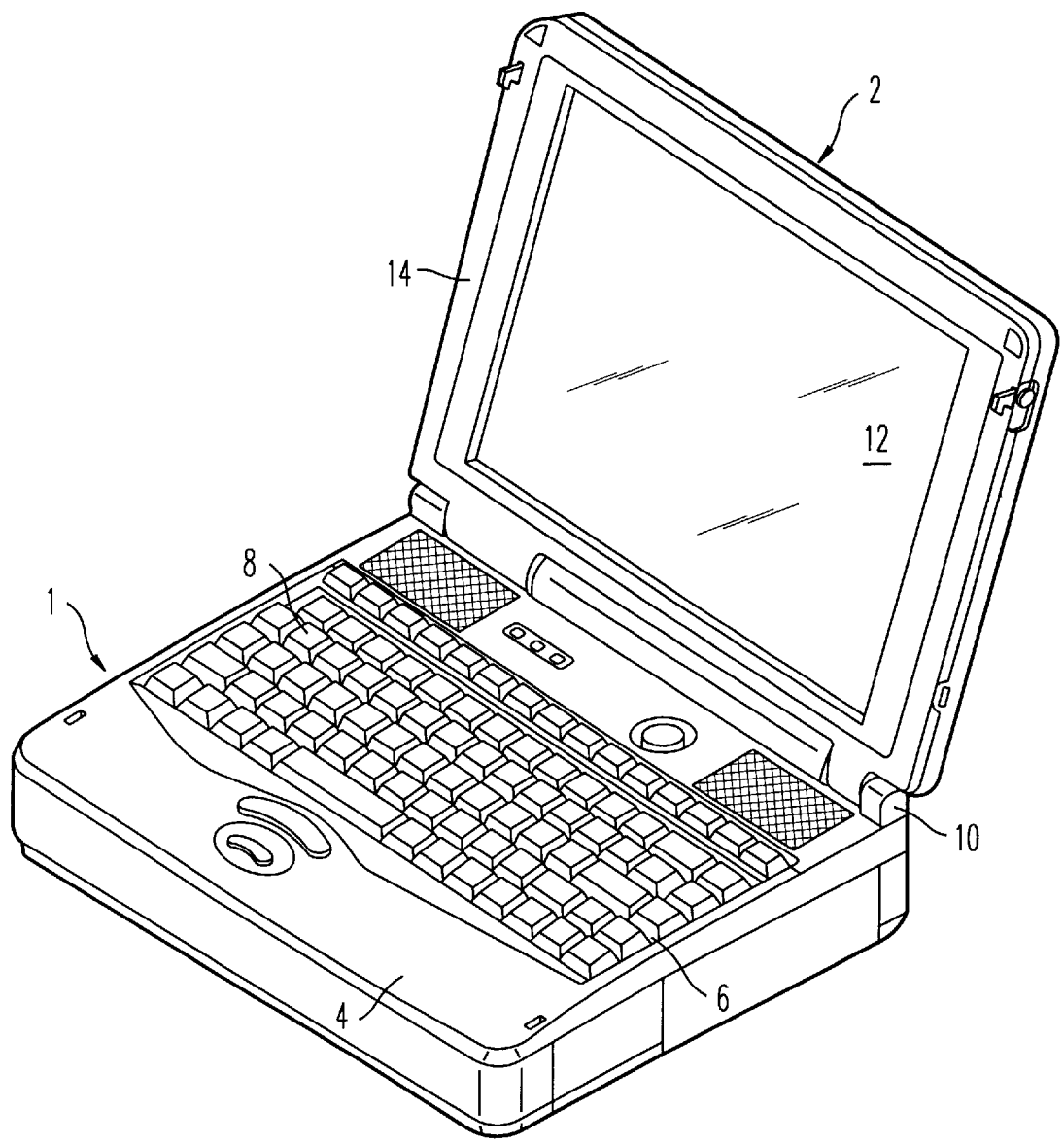
FIG. 1 is a perspective view of a hand-held computer of a preferred embodiment of the present invention.

FIG. 1 illustrates a hand-held computer with a slim body comprising a main body 1 and a rotatable display unit 2 that is attached to the main body 1 so as to cover the main body 1 when the computer is closed. The main body 1 is made of a synthetic resin and has a palm rest portion 4 with an opening 6 for attaching a key board 8.

Along one elongate edge of the main body 1, a mound portion 10 is provided for attaching the rotatable display unit 2. The display unit 2 includes a display screen 12, i.e. a liquid crystal display and a housing 14 for the display screen 12.

Figure 2:
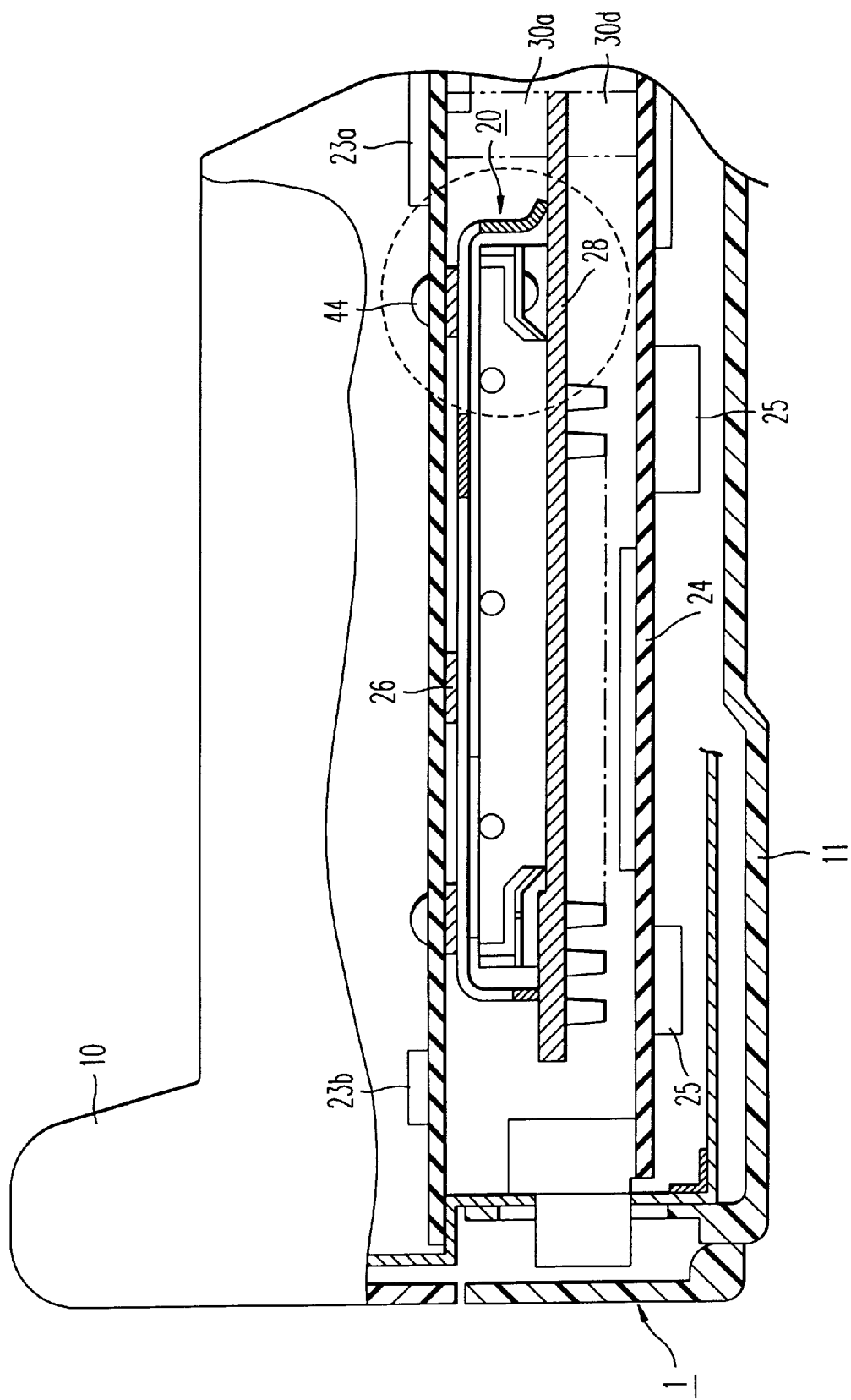
FIG. 2 is a cross-sectional view obtained by partially cutting off the main body of the hand-held computer in FIG. 1.
Figure 3:
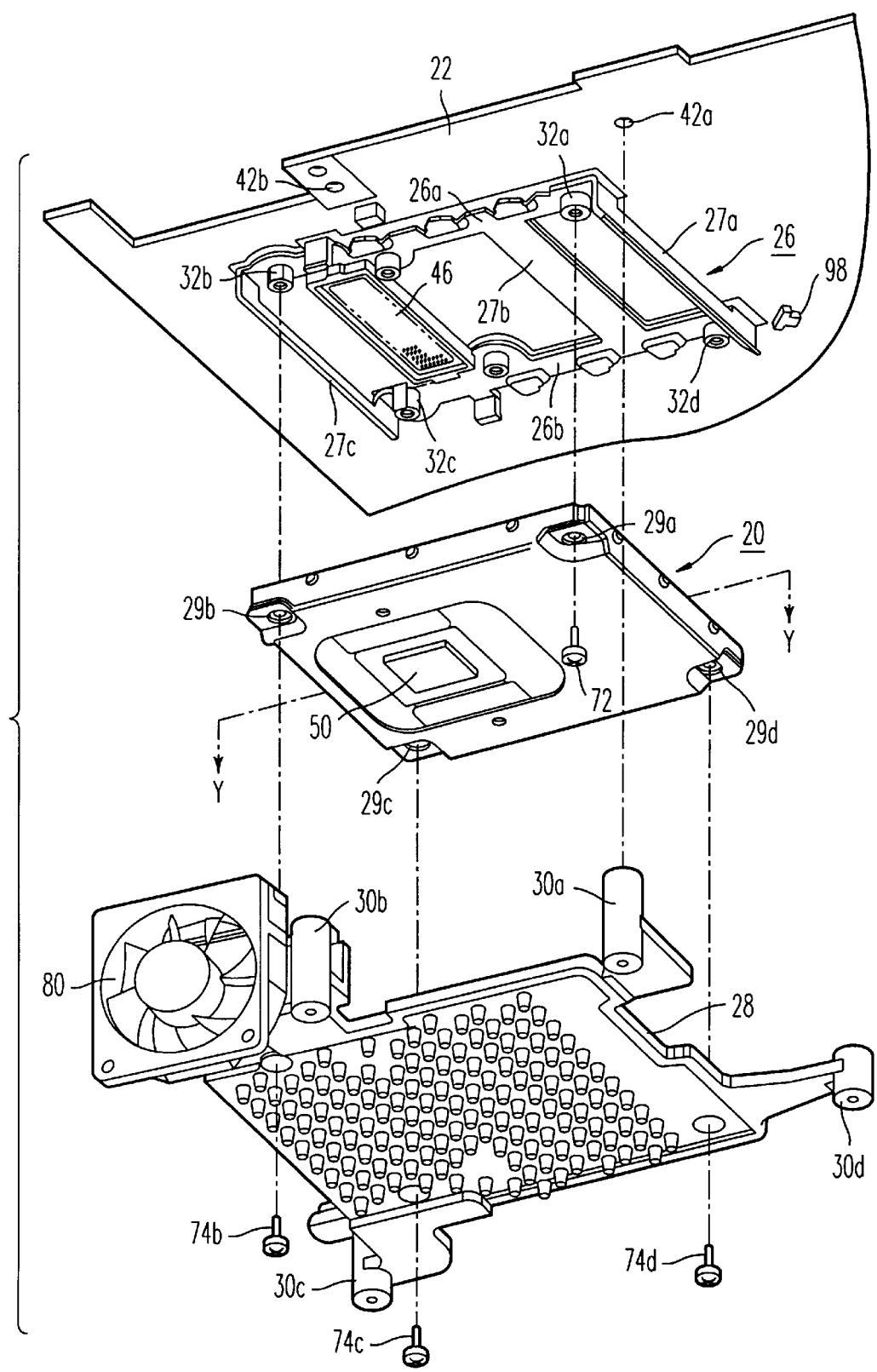
FIG. 3 is an exploded perspective view of elements shown in FIG. 2.

FIG. 2 is a section view partially cut off the main body 1 of the computer. As shown in FIGS. 2 and 3, a circuit module, i.e. a CPU module 20 is mounted on a first base circuit board 22 parallel to a bottom face 11 of the main body 1 through a holder 26 which has a plurality of supporting rails 26a and 26b. A plurality of first circuit elements 23a and 23b, such as an IC package or a connector, is mounted on a top surface of the first base circuit board 22.

Further, as shown in FIG. 2, a second base circuit board 24 is fixed on the bottom face 11 of the main body 1 by a fixing means, such as screws. On the second base circuit board 24, a plurality of second circuit elements 25 is mounted thereunder on a bottom surface, similar to the first base circuit board 22. For simplification, hereinafter, the function of the present invention is explained by using only the first base circuit board 22. However, it is, of course, necessary to achieve the functions of the present invention by also using the second circuit board 24.

Under the CPU module 20 in FIG. 2, a heat sink device 28 is provided parallel to the second base circuit board 24 for cooling heat emitted from the CPU module 20. The heat sink device 28 is made of a light metal material having a good thermal conductivity, such as a magnesium alloy. The heat sink device 28 includes a top radiation panel and a plurality of bottom cooling projections. As shown in FIG. 2 by dashed lines, the heat sink device 28 is attached to the first base circuit board and the second base circuit board 24 through a plurality of pedestals 30a, 30d provided on the corners of the radiation panel.

The first base circuit board 22 in FIG. 3 and the second base circuit board 24 in FIG. 2 are electrically coupled with each other through a stacking connector (not shown).

FIG. 3 is a disassembled perspective view for explaining the mount of the CPU module 20, the CPU holder 26, and the heat sink device 28 on the first base circuit board 22.

As illustrated in FIG. 3, the CPU module 20 is mounted on the first base circuit board 22 through the CPU holder 26 made of metal. As an example, the CPU holder 26 is comprised of the pair of lateral supporting rails 26a, 26b and a plurality, e.g. three cross rails 27a–27c connected with each of the lateral rails 26a, 26b. Further, a plurality, e.g., four bosses 32a–32d are fixed on each of the edge portions of the two lateral supporting rails 26a and 26b by caulking. The bosses 32a–32d are made of a metal material for permitting electrical conductivity. Each of the bosses 32a–32d includes a through hole for attaching the CPU module 20 to the holder 26 on the base circuit board 22.

The CPU module 20 also includes a plurality of apertures for attachment to the holder 26 through fixing means, such as a plurality of set screws 72 and 74b–74d. A through hole 29a in the CPU module 20 and the metal boss 32a are directly connected by the set screw 72. The remaining through holes 29b–29d in the CPU module 20 are further coupled with the heat sink device 28 by the plurality of set screws 74b–74d.

The heat sink device 28 includes the top radiation panel facing towards the CPU module 20 and a multiplicity of radiating projections thereunder for securing a sufficient heat sink effect. At a corner portion of the heat sink device 28, a fan 80 is supported by a molded support structure of the radiation panel. The fan 80 is comprised of a motor-driven fan, a fan frame and a rotor. The fan frame is also made of a metal material having a sufficient thermal conductivity, such as an aluminum alloy for functioning as a part of the radiation panel. The motor-driven fan is coupled to a control circuit on the first base circuit board 22 through lead wires (not shown). As will be explained later, when a thermal detecting device detects that the temperature in the CPU module 20 has reached a predetermined value, the control circuit instructs the rotor to drive the motor of the fan 80 to cool down the temperature in the CPU module 20. Because of the fan 80, the equipment of the computer has an air exit.

Figure 4:
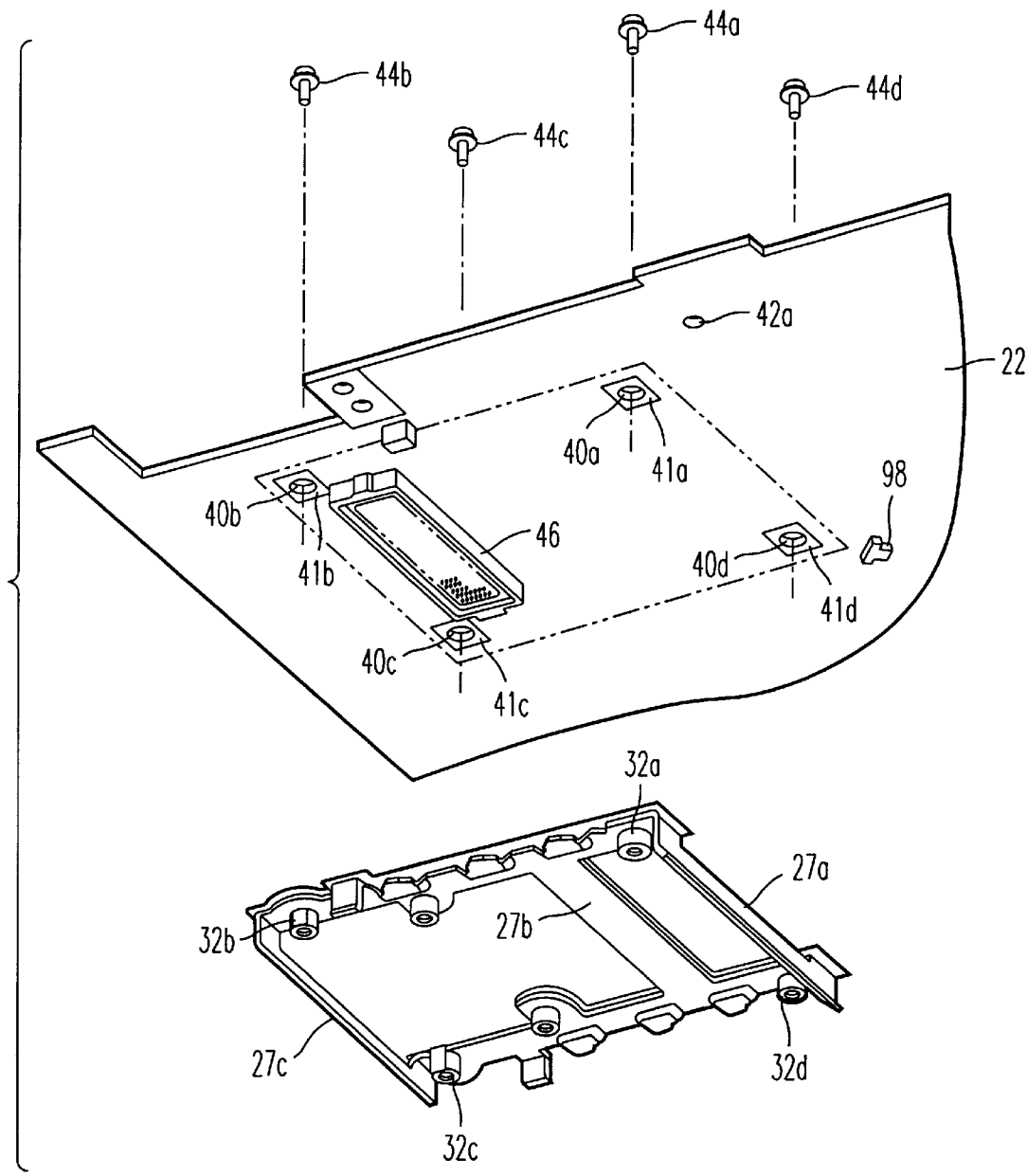
FIG. 4 is a further exploded perspective view of the elements shown in FIG. 3.

As shown in FIG. 4, the first base circuit board 22 has four through holes 40a–40d at positions corresponded to the plurality of bosses 32a, 32b, 32c and 32d, respectively, which are joined by the cross rails 27a and 27c. The inside of the through holes 40a–40d are coated by a solder layer which is connected to a printed grounding pattern (not shown) in the first base circuit board 22 for securing electrical conductivity. Further, the solder layer in each of the through holes 40a–40d is connected to a plurality of land portions 41a–41d provided on the CPU mounting surface side of the first base circuit board 22.

Thus, as shown in FIG. 3, the CPU module 20 is mounted in a predetermined CPU mounting area on the first base circuit board 22 through the holder 26 by fixing fasteners through the respective holes in the base circuit board 22 and into the corresponding bosses. As shown in FIG. 4, fasteners, such as screws 44a, 44b, 44c and 44d, accomplish this function. The predetermined mounting area is indicated by a rectangle in dashed lines on the underside of the base circuit board 22.

Figure 5:
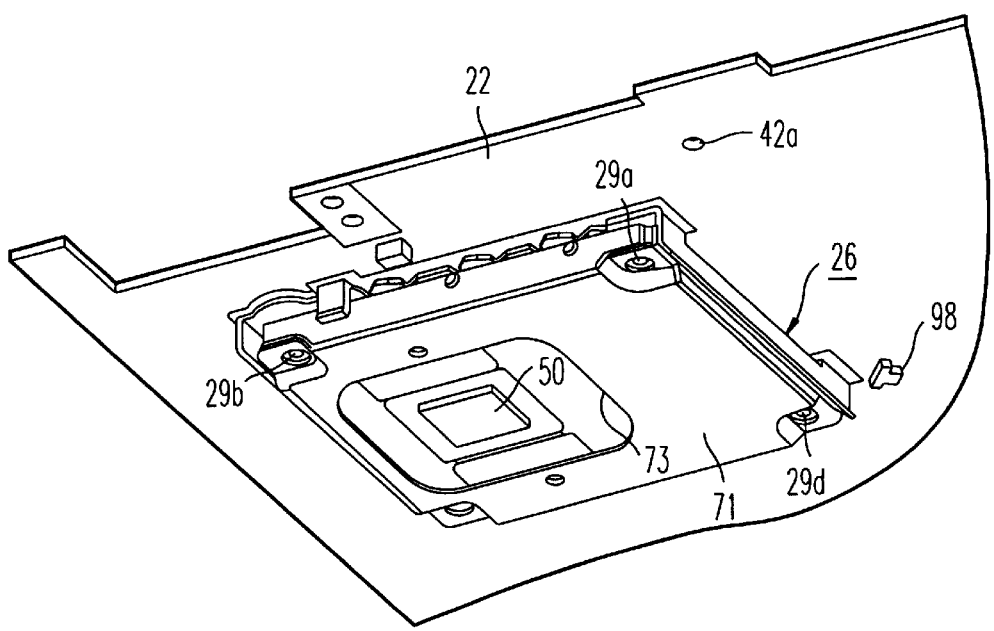
FIG. 5 is a perspective view of the circuit module attached to the base circuit board.

FIG. 5 illustrates the mounted feature of the holder 26 on the first base circuit board 22. As shown in FIG. 4, the base circuit board 22 further provides a first interface connector 46 in the predetermined mounting area for coupling to a second connector provided in the CPU module 20. The first interface connector 46 is connected by flip-chip bonding through a plurality of solder balls to the underside of the base circuit board 22.

Figure 6:
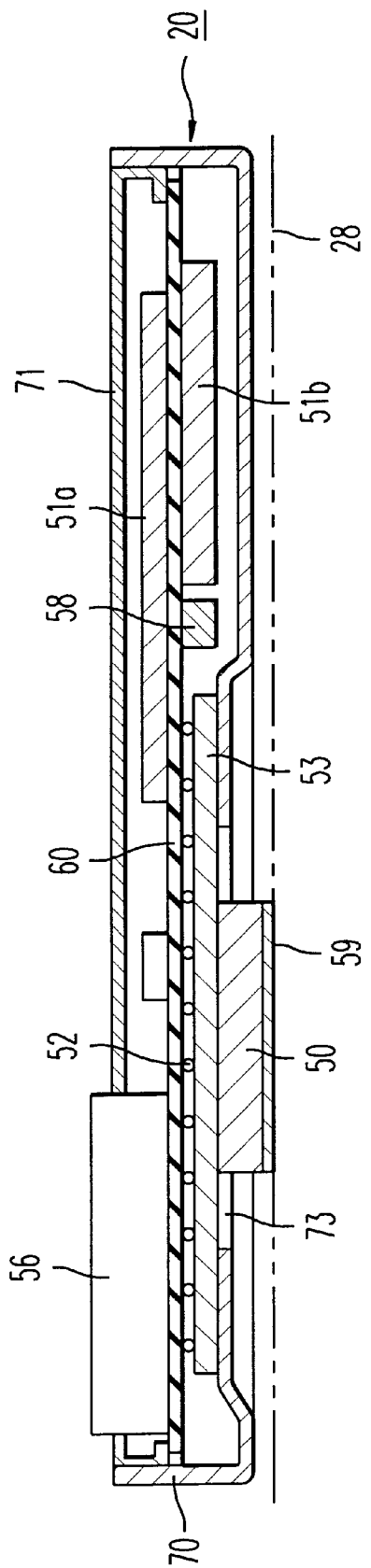
FIG. 6 is a cross-sectional view of the circuit module of FIG. 5 taken along the Y—Y line of FIG. 3.

FIG. 6 is a section view of the CPU module 20 cut along the Y—Y line shown in FIG. 3. The CPU module 20 includes a plurality of IC packages 50, 51a and 51b mounted on a multi-layered wiring board 60. In this embodiment, the IC package 50 is a ball-grid-array (BGA) type IC package that is flip-chip bonded by a plurality of solder balls 52 to the multi-layered wiring board 60 through a base plate 53. The other IC packages 51a and 51b are a quad-flat-package (QFP) type.

The multi-layered wiring board 60 with the plurality of IC packages 50, 51a and 51b mounted thereto is fixed in a module housing case 70 made of a metal material having a good thermal conductivity, such as an aluminum alloy. The module housing case 70 has an aperture 73 facing towards the heat sink device 28 for permitting heat to escape from the IC package 50. In this embodiment, the aperture 73 is positioned around the BGA-type IC package 50. Since the BGA-type IC package 50 processes many kinds of multi-media information, such as character signals, audio signals and image signals, it emits a large amount of heat during its operation. Accordingly, one needs to cool the heat by the heat sink device 28.

The CPU module 20 includes a second interface connector 56 mounted on the wiring board 60 for coupling to the first interface connector 46 provided on the first base circuit board 22 (FIG. 4). By coupling the second interface connector 56 with the first interface connector 46, the CPU module 20 is electrically connected to the first base circuit board 22 (FIG. 3).

As shown in FIG. 6, the CPU module 20 includes a temperature detecting means 58, such as a thermistor, for detecting the temperature inside the CPU module 20. When the thermistor 58 detects that the temperature in the CPU module 20 has reached a predetermined value, it sends this thermal information to a control circuit on the first base circuit board 22 through the interface connections of the first connector 46 on the base circuit board 22 and the second connector 56 of the CPU module 20 for driving the fan 80 (FIG. 3).

During the operation of the computer, as shown in FIG. 6, the heat emitted from the IC chip package 50 is transferred to the heat sink device 28 through grease material 59 having a sufficient thermal conductivity. The transferred heat from the CPU module 20 is diffused through the multiplicity of radiation projections on the underside of the heat sink device 28 with cooling wind from the fan 80 (FIG. 3).

Figure 7A:
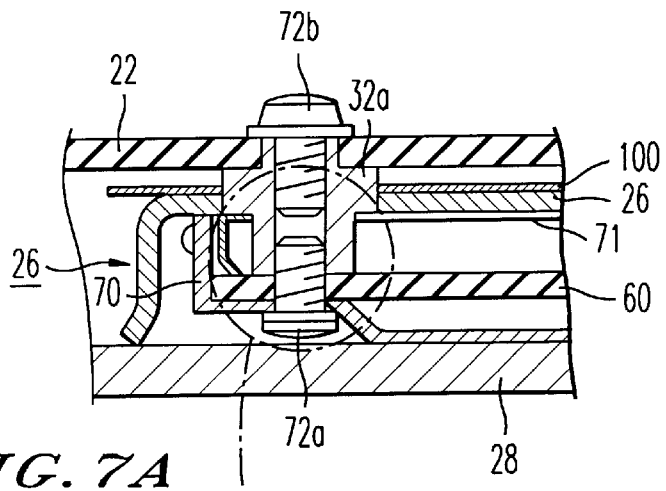
FIG. 7A is an enlarged cross-sectional view of a portion shown by a dotted circle in FIG. 2.
Figure 7B:
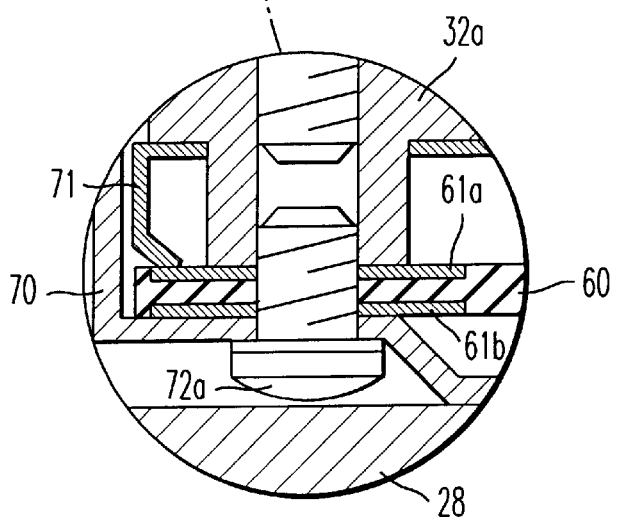
FIG. 7B is a further enlarged cross-sectional view of a portion shown by a dotted circle in FIG. 7A.
Figure 7C:
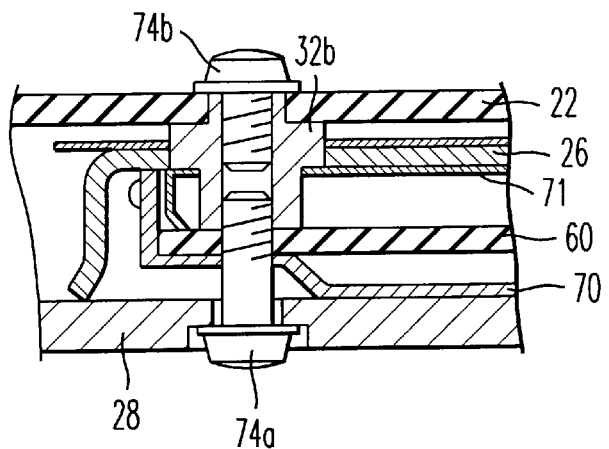
FIG. 7C is a cross-sectional view showing another embodiment similar to FIG. 7A.

In particular, the enhanced grounding connection between the multi-chip CPU module 20 and the first base circuit board 22 is performed by a particular structure shown in FIGS. 7A, 7B and 7C.

FIG. 7A illustrates the connection between the holder 26 and the first base circuit board 22 by the set screws 72a, 72b through the boss 32a. An insulating layer 100 is provided between the first base circuit board 22 and the holder 26. FIG. 7B shows a more detailed structure of FIG. 7A.

As illustrated in FIG. 7B, the multi-layered wiring board 60 includes a pair of grounding wiring patterns 61a and 61b facing toward upper and lower surfaces of the wiring board 60, respectively. One surface of the metal boss 32a is directly connected to the grounding wiring pattern 61a on top of the multi-layered wiring board 60. The opposite surface of the metal boss 32a is directly connected to the land portion 41a on the first base circuit board 22, as previously shown in FIG. 4. The land portion 41a is connected to the grounding pattern on the circuit board 22 through the hole 40a. Consequently, through the metal boss 32a, the grounding wiring pattern 61a on the wiring board 60 of FIG. 7B is connected to the grounding pattern on the first base circuit board 22.

FIG. 7C illustrates a second embodiment of the connection of the holder 26 and the first base circuit board 22 with the heat sink device 28. The connection between the grounding wiring patterns 61a, 61b on the wiring board 60 and the grounding pattern on the circuit board 22 is achieved similar to the structure in FIG. 7B.

As illustrated in FIG. 3, the respective metal bosses are provided on the metal holder 26. Thus, the respective bosses are electrically connected in parallel with each other. Consequently, as shown in FIGS. 7A and 7B, the grounding connection between the grounding wiring patterns 61a, 61b on the wiring board 60 and the grounding pattern on the circuit board 22 is largely enhanced without any change in the connection structure of the circuits.

As shown in FIG. 3, the grounding connection of the CPU module 20 is performed through the metal holder 26. Consequently, one need not provide another grounding terminal in the interface connector 46 of FIG. 3 and the interface connector 56 of FIG. 6 for enhancing the grounding connection between the grounding wiring patterns 61a, 61b on the wiring board 60 of FIG. 7B and the grounding pattern on the circuit board 22 of FIG. 7A.

Further, the structure in FIG. 3 includes pedestals 30a–30d having a respective predetermined height and being attached to the heat sink device 28. The height of the pedestals 30a–30d define the particular space between the CPU module 20 and the first base circuit board 22. Consequently, the influences due to the height variations between the interface connectors are removed.

It is also possible to maintain a clearance between the IC chip package 50 and the top radiation panel surface of the heat sink device 28 at a constant value. Consequently, it is possible to diffuse effectively the heat from the IC chip package 50 without any bad influences on the radiation panel surface.

Also, the structure can avoid loading the weight of the CPU module 20 on the first interface connector 46 of FIG. 3 and the second interface connector 56 of FIG. 6. Consequently, it becomes possible to simplify the stricture of the interface connectors and permits one to reduce the manufacturing cost of them.

Furthermore, the boss 32a in FIGS. 7A–7B and the boss 32b in FIG. 7C have an outer edge projection for securing a connection between an upper cover 71 of the housing case 70 and the first base circuit board 22 by fastening the set screws 72a and 72b through the hole in the boss 32a of FIGS. 7A–7B and the boss 32b of FIG. 7C. Further, a flange portion of the upper cover 71 of the housing case 70 is connected to the printed grounding pattern 61a, 61b on the multi-layered wiring board 60 for further enhancing the grounding connection of the circuit module.

Figure 8:
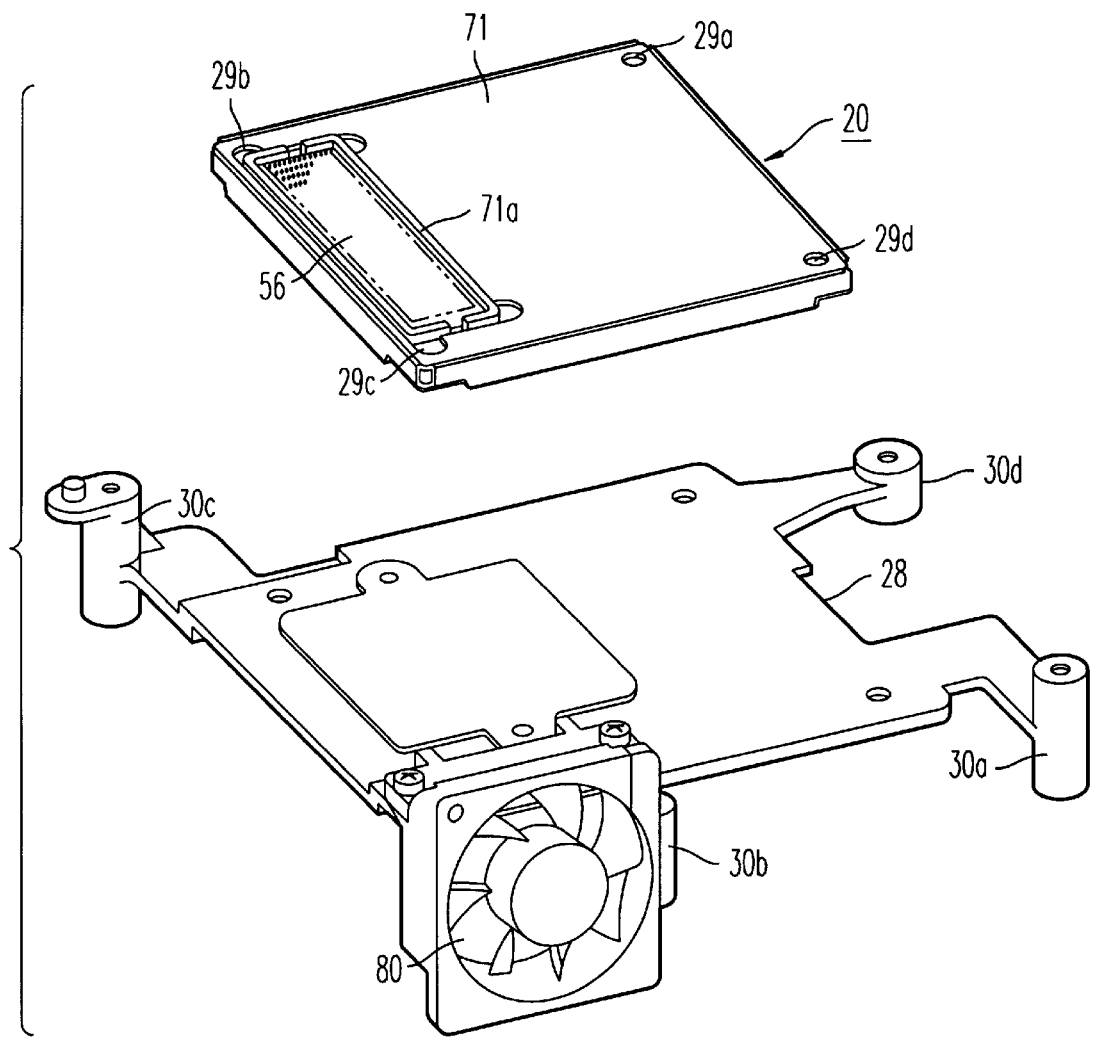
FIG. 8 is a perspective view showing the attaching relationship between the CPU module and the heat sink device.

FIG. 8 illustrates upper sides of the CPU module 20 and the radiation panel of the heat sink device 28. The upper cover 71 of the CPU module 20 has an aperture 71a for connecting the second interface connector 56 in the CPU module 20 to the first interface connector 46 of the first base circuit board 22 (FIG. 4).

Figure 9:
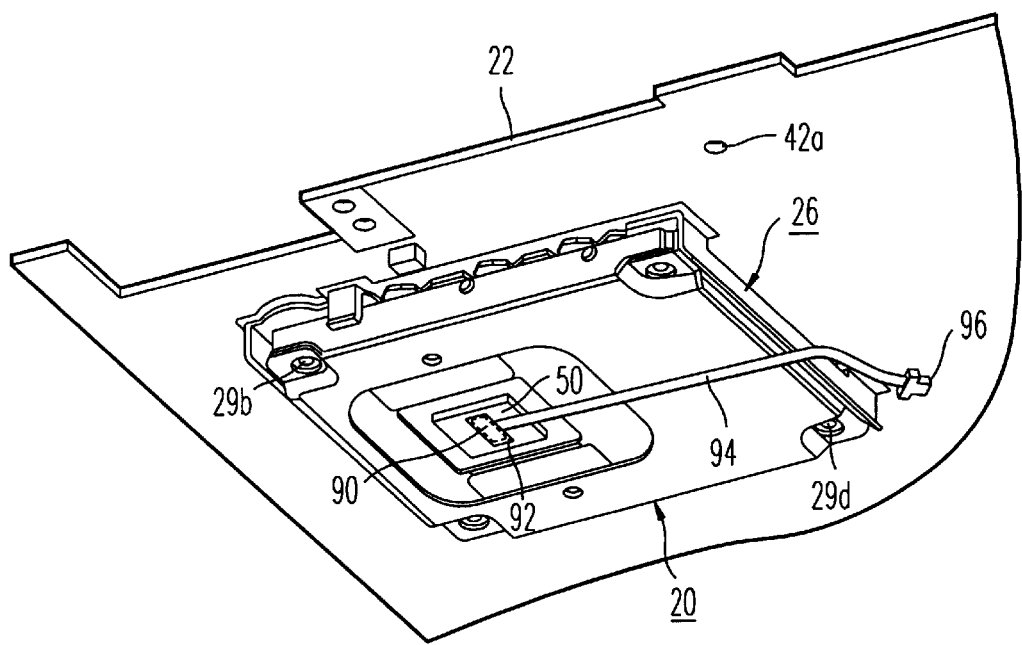
FIG. 9 is a perspective view of the CPU module of another embodiment.
Figure 10:
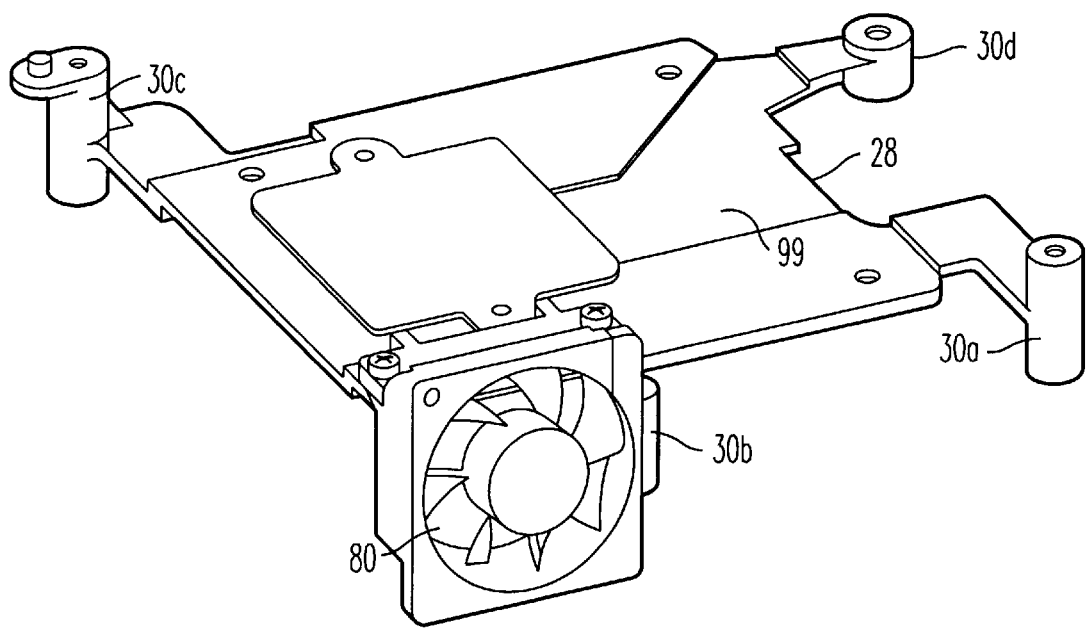
FIG. 10 is a perspective view showing an upper concave portion of the heat sink device, similar to FIG. 8.

FIGS. 9 and 10 show a structure in which an additional temperature measuring element is provided in the CPU module 20 and the corresponding heat sink device 28, respectively.

As illustrated in FIG. 9, an additional thermistor 90 is provided on an outer surface of the IC chip package 50. A flexible connecting board 92 is provided over the thermistor 90. A flexible lead-out cable 94 is connected to the flexible connecting board 92. As illustrated in FIG. 10, the radiation panel of the heat sink device 28 has a groove portion 99 for fitting the cable 94 of FIG. 9 between the CPU module 20 and the heat sink device 28. The cable 94 of FIG. 9 has a cable connector 96 for connecting to a connector 98 (FIGS. 3 and 5) provided on the first base circuit board 22 for connecting to the control circuit on the same base circuit board 22.

This arrangement permits sufficient control of the fan drive, depending upon the different temperatures in the CPU module 20. Even if one of the thermistors 58 or 90 breaks down, the other one can replace it and can continue to detect the temperature of the CPU module 20 in order to prevent the computer from working an erroneous operation due to the heat in the CPU module 20.

Obviously, numerous modifications and variations of the present invention are possible in light of the above teachings. It is therefore to be understood that, within the scope of the appended claims, the invention may be practiced otherwise than as specifically described herein.

What is claimed as new and is desired to be secured by Letters Patent of the United States is:

1. A circuit module mounting structure, comprising:
  a circuit module including a wiring board provided with a wiring pattern, a plurality of IC chips mounted on the wiring board, and a housing case for containing the wiring board, wherein said plurality of IC chips are connected to the wiring pattern, said wiring board has a plurality of first holes through the wiring pattern, and said housing case has a plurality of second through holes corresponding to the first through holes;
  a base circuit board for mounting the circuit module in a predetermined mounting area on the base circuit board which has a plurality of third through holes corresponding to the first through holes in the wiring board, wherein each of the plurality of third through holes is surrounded by a land portion provided on the base circuit board for securing a connection to the wiring pattern within the predetermined mounting area;
  a holder for supporting the circuit module at the predetermined mounting area on the base circuit board, wherein said holder includes a plurality of attached bosses for coupling together the plurality of first through holes in the wiring board and the plurality of second through holes in the housing case, respectively; and fasteners for commonly fixing the plurality of attached bosses through the plurality of first through holes in the wiring board and also for fixing the plurality of attached bosses through the plurality of second through holes in the housing case.

2. The circuit module mounting structure of claim 1, wherein:

said housing case of the circuit module includes an opening for diffusing heat emitted from the plurality of IC chips in the circuit module; and the circuit module mounting structure further comprising:

a heat sink device including a radiating panel for cooling the diffused heat from the opening in the circuit module, said heat sink device further including a plurality of pedestals for attaching the heat sink device to the base circuit board while covering the circuit module and also while keeping a predetermined space between the opening in the housing case and the radiating panel.

3. The circuit module mounting structure of claim 1, wherein:

each of the plurality of bosses includes a fourth through hole for inserting the fasteners therethrough.

4. The circuit module mounting stricture of claim 3, wherein:

each of the plurality of bosses further includes a flange portion for firmly attaching the housing case to the wiring board.

5. The circuit module mounting structure of claim 2, wherein:

said radiating panel further includes a plurality of fifth through holes corresponding to the plurality of first through holes for fixing the plurality of bosses to the radiating panel.

6. The circuit module mounting structure of claim 1, further comprising:

an insulating layer arranged between the base circuit board and the holder.

7. The circuit module mounting structure of claim 1, wherein:

said fasteners for connecting through each of the plurality of first through holes and each of the plurality of second through holes is a pair of set screws.

8. The circuit module mounting structure of claim 1, wherein:

said base circuit board further includes a first interface connector provided in the predetermined mounting area of the base circuit board; and said circuit module further includes a second interface connector provided on the wiring board and projected through the housing case for coupling to the first interface connector.

9. The circuit module mounting structure of claim 1, wherein:

said fasteners firmly fix together the wiring pattern on the wiring board and the plurality of bosses attached on the holder through the housing case of the circuit module.

10. The circuit module mounting structure of claim 1, wherein:

said wiring board is made by a multi-layered construction including the wiring pattern.

11. The circuit module mounting structure of claim 2, wherein:

said circuit module further includes a thermistor for measuring temperatures in the circuit module.

12. The circuit module mounting structure of claim 11, wherein:

said thermistor is provided on one of the plurality of IC chips facing towards the opening in the housing case for the circuit module.

13. A hand-held computer having a CPU module mounting structure, comprising:

a CPU module including a wiring board provided with a wiring pattern, a plurality of IC chips mounted on the wiring board, and a housing case for containing the wiring board, wherein said plurality of IC chips are connected to the wiring pattern, said wiring board has a plurality of first holes through the wiring pattern, and said housing case has a plurality of second through holes corresponding to the first through holes;

a base circuit board for mounting the CPU module in a predetermined mounting area on the base circuit board which has a plurality of third through holes corresponding to the first through holes in the wiring board, wherein each of the plurality of third through holes is surrounded by a land portion provided on the base circuit board for securing a connection to the wiring pattern within the predetermined mounting area;

a holder for supporting the CPU module at the predetermined mounting area on the base circuit board, wherein said holder includes a plurality of attached bosses for coupling together the plurality of first through holes in the wiring board and the plurality of second through holes in the housing case, respectively; and fasteners for commonly fixing the plurality of attached bosses with the plurality of first through holes in the wiring board and also for fixing the plurality of attached bosses with the plurality of second through holes in the housing case.

14. The hand-held computer having a CPU module mounting structure of claim 13, wherein:

said housing case of the CPU module includes an opening for diffusing heat emitted from the plurality of IC chips in the CPU module; and the CPU module mounting structure further comprising:

a heat sink device including a radiating panel for cooling the diffused heat from the opening in the CPU module, said heat sink device further including a plurality of pedestals for attaching the heat sink device to the base circuit board while covering the CPU module and also while keeping a predetermined space between the opening in the housing case and the radiating panel.

15. The hand-held computer having the CPU module mounting structure of claim 13, wherein:

said housing case includes an opening against a ball-grid-array type IC chip among the plurality of IC chips; and the CPU module mounting structure further comprising:

a heat sink device including a radiating panel and a plurality of pedestals for attaching the heat sink device to the base circuit board while keeping a predetermined space between the opening in the housing case and the radiating panel.

16. A method for mounting a circuit module stricture, comprising the steps of:

providing a circuit module comprised of a wiring board provided with a wiring pattern, a plurality of IC chips mounted on the wiring board, and a housing case for containing the wiring board, wherein said plurality of IC chips are connected to the wiring pattern, said wiring board has a plurality of first holes through the wiring pattern, and said housing case has a plurality of second through holes corresponding to the first through holes;

mounting said circuit module on a base circuit board at a predetermined mounting area on the base circuit board which has a plurality of third through holes corresponding to the first through holes of the wiring board, wherein each of the plurality of third through holes is surrounded by a land portion provided on the base circuit board for securing a connection to the wiring pattern within the predetermined mounting area;

supporting the circuit module at the predetermined mounting area on the base circuit board by using a holder which is comprised of a supporting frame and a plurality of bosses attached to the frame for coupling together the plurality of first through holes in the wiring board and the plurality of second through holes in the housing case, respectively; and fixing the plurality of attached bosses to the housing case through the plurality of first through holes in the wiring board and also for fixing the plurality of attached bases through the plurality of second through holes in the housing case.

17. The method of claim 16, further comprising a step of:

cooling heat emitted from the plurality of IC chips in the CPU module by using a radiating panel and a plurality of pedestals attached to the radiating panel for keeping a predetermined space between the CPU module and the radiating panel.

18. The method of claim 16, wherein:

said fixing step is performed by commonly coupling the plurality of first through holes in the wiring board, said plurality of second through holes in the housing case, and said plurality of third through holes in the base circuit board with fasteners.

19. The method of claim 17, further comprising a step of:

measuring a temperature in the CPU module before the cooling step.

\* \* \* \* \*